United States Patent
Carta et al.

(10) Patent No.: US 11,557,343 B2
(45) Date of Patent: Jan. 17, 2023

(54) PULSING SYNAPTIC DEVICES BASED ON PHASE-CHANGE MEMORY TO INCREASE THE LINEARITY IN WEIGHT UPDATE

(71) Applicant: INTERNATIONAL BUSINESS MACHINES CORPORATION, Armonk, NY (US)

(72) Inventors: Fabio Carta, Pleasantville, NY (US); Matthew Joseph BrightSky, Armonk, NY (US); Wanki Kim, Chappaqua, NY (US); Maxence Bouvier, Paladru (FR); SangBum Kim, Suwanee, GA (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 17/304,503

(22) Filed: Jun. 22, 2021

(65) Prior Publication Data

US 2022/0406377 A1    Dec. 22, 2022

(51) Int. Cl.
| | | |
|---|---|---|
| *G11C 11/00* | (2006.01) | |
| *G11C 13/00* | (2006.01) | |
| *G11C 11/54* | (2006.01) | |
| *G06N 3/06* | (2006.01) | |

(52) U.S. Cl.
CPC .......... *G11C 13/0069* (2013.01); *G11C 11/54* (2013.01); *G11C 13/0004* (2013.01); *G06N 3/061* (2013.01); *G11C 2013/0092* (2013.01)

(58) Field of Classification Search
CPC . G11C 13/0069; G11C 11/54; G11C 13/0004; G11C 2013/0092

USPC .......................................................... 365/163
See application file for complete search history.

(56) References Cited

U.S. PATENT DOCUMENTS

| | | | |
|---|---|---|---|
| 6,999,953 B2 | 2/2006 | Ovhsinsky | |
| 8,447,714 B2 | 5/2013 | Breitwisch | |
| 8,682,822 B2 | 3/2014 | Modha | |
| 9,189,732 B2 | 11/2015 | Bichler | |
| 9,227,378 B2 * | 1/2016 | Colombo | H01L 45/1666 |
| 9,996,793 B2 | 6/2018 | Eleftheriou | |
| 10,460,237 B2 | 10/2019 | Kara | |
| 10,490,273 B1 * | 11/2019 | Ishii | G06N 3/063 |
| 2004/0114419 A1 | 6/2004 | Lowrey | |
| 2017/0364790 A1 * | 12/2017 | Leobandung | G06N 3/063 |
| 2018/0330236 A1 | 11/2018 | Hou | |
| 2019/0034788 A1 | 1/2019 | Burr | |

(Continued)

OTHER PUBLICATIONS

Carta, et al., "Pulsing Synaptic Devices Based on Phase-Change Memory to Increase the Linearity in Weight Update," Application and Drawings, Filed on May 19, 2022, 22 Pages, Related PCT Patent Application Serial No. PCT/EP2022/063616.

(Continued)

*Primary Examiner* — Vu A Le
(74) *Attorney, Agent, or Firm* — Robert D. Bean

(57) ABSTRACT

According to one embodiment, a method, computer system, and computer program product for increasing linearity of a weight update of a phase change memory (PCM) cell is provided. The present invention may include applying a RESET pulse to amorphize the phase change material of the PCM cell; responsive to applying the RESET pulse, applying an incubation pulse to the PCM cell; and applying a plurality of partial SET pulses to incrementally increase the conductance of the PCM cell.

20 Claims, 4 Drawing Sheets

(56) References Cited

U.S. PATENT DOCUMENTS

2020/0365203 A1 11/2020 Bai

OTHER PUBLICATIONS

International Searching Authority, "Notification of Transmittal of the International Search Report and the Written Opinion of the International Searching Authority, or Declaration," Patent Cooperation Treaty, dated Aug. 22, 2022, # pages, International Application No. PCT/EP2022/063616.

Burr, et al., "Experimental Demonstration and Tolerancing of a Large-Scale Neural Network (165 000 Synapses) Using Phase-Change Memory as the Synaptic Weight Element," IEEE Transactions on Electron Devices, Nov. 2015 [accessed on Apr. 19, 2021], pp. 3498-3507, vol. 62, Issue 11, IEEE, DOI: 10.1109/TED.2015.2439635, Retrieved from the Internet: <URL: https://ieeexplore.ieee.org/document/7151827>.

Chen, et al., "Mitigating effects of non-ideal synaptic device characteristics for on-chip learning," 2015 IEEE/ACM International Conference on Computer-Aided Design (ICCAD), Nov. 2-6, 2015 [Accessed on Apr. 19, 2021], pp. 194-199, IEEE, Austin, TX, US, DOI: 10.1109/ICCAD.2015.7372570, Retrieved from the Internet: <URL: https://ieeexplore.ieee.org/document/7372570>.

Gokemen, et al., "Acceleration of Deep Neural Network Training with Resistive Cross-Point Devices: Design Considerations," Frontiers in Neuroscience [online], Jul. 21, 2016 [accessed on Apr. 19, 2021], 19 pages, vol. 10, DOI: 10.3389/fnins.2016.00333, Retrieved from the Internet: <URL: https://www.frontiersin.org/articles/10.3389/fnins.2016.00333/full>.

Ielmini, et al., "Analytical model for subthreshold conduction and threshold switching in chalcogenide-based memory devices," Journal of Applied Physics, 2007, 14 pages, vol. 102, Issue 5, DOI: 10.1063/1.2773688, Retrieved from the Internet: <URL: https://aip.scitation.org/doi/pdf/10.1063/1.2773688>.

Senkader, et al., "Models for phase-change of Ge2Sb2Te5 in optical and electrical memory devices," Journal of Applied Physics, 2004, 9 pages, vol. 95, Issue 2, DOI: 10.1063/1.1633984, Retrieved from the Internet: <URL: https://aip.scitation.org/doi/10.1063/1.1633984>.

Suri, et al., "Phase Change Memory as Synapse for Ultra-Dense Neuromorphic Systems: Application to Complex Visual Pattern Extraction," 2011 International Electron Devices Meeting, Dec. 5-7, 2011, pp. 79-82, IEEE, Washington, DC, USA, DOI: 10.1109/IEDM.2011.6131488, Retrieved from the Internet: <URL: http://ieeexplore.ieee.org/document/6131488/>.

\* cited by examiner

PULSING SYNAPTIC DEVICES BASED ON PHASE-CHANGE MEMORY TO INCREASE THE LINEARITY IN WEIGHT UPDATE

BACKGROUND

The present invention relates, generally, to the field of computing, and more particularly to phase-change memory.

Phase-change memory, or PCM, is a type of non-volatile random-access memory that utilizes a semiconductor alloy that can be changed rapidly between an ordered, crystalline phase having a low electrical resistance to a disordered, amorphous phase with high electrical resistance; the resistance of a current running through the PCM cell can be measured to identify the phase of the cell, allowing the cell to store a bit of information and function as a memory. PCM is non-volatile because no electrical power is required to maintain either phase of the material. PCM has the potential to be a strong candidate for storage class memory in order to fill the performance gap between flash memory and DRAM, and may offer powerful benefits in speed and scalability, non-volatility, and power consumption among others.

SUMMARY

According to one embodiment, a method, computer system, and computer program product for increasing linearity of a weight update of a phase change memory (PCM) cell is provided. The present invention may include applying a RESET pulse to amorphize the phase change material of the PCM cell; responsive to applying the RESET pulse, applying an incubation pulse to the PCM cell; and applying a plurality of partial SET pulses to incrementally increase the conductance of the PCM cell.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
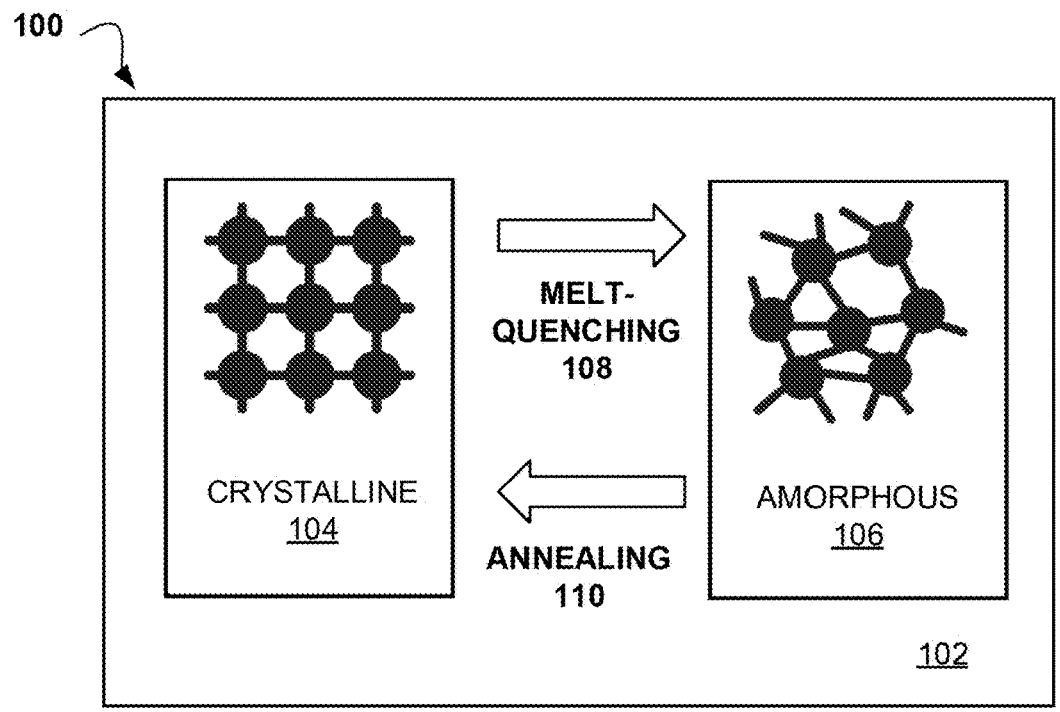
FIG. 1 illustrates a phase-change cycle of phase change material used in phase change memory (PCM) according to at least one embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to the field of computing, and more particularly to phase-change memory. The following described exemplary embodiments provide a system, method, and program product to, among other things, increase the linearity and uniformity of weight updates by modifying RESET voltage, applying a post-RESET annealing pulse, modifying weight update pulse width and amplitude, and/or applying a pre-annealing pulse to the weight update pulse. Therefore, the present embodiment has the capacity to improve the technical field of phase-change memory by improving the consistency and precision with which electrical pulses applied to the PCM change the resistance/conductivity of the PCM, enabling the PCM cell to achieve intermediate states between the amorphous and crystalline phases, and thereby improving the amount of information each PCM cell is capable of storing.

As previously described, phase-change memory, or PCM, is a type of non-volatile random-access memory that utilizes a semiconductor alloy that can be changed rapidly between an ordered, crystalline phase having a low electrical resistance to a disordered, amorphous phase with high electrical resistance; the resistance of a current running through the PCM cell can be measured to identify the phase of the cell, allowing the cell to store a bit of information and function as a memory. PCM is non-volatile because no electrical power is required to maintain either phase of the material. PCM has the potential to be a strong candidate for storage class memory in order to fill the performance gap between flash memory and DRAM, and may offer powerful benefits in speed and scalability, non-volatility, power consumption among others.

One advantage of phase change memory is its promising applications in neuromorphic computing. The human brain, with less than 20 watts of power consumption, offers a processing capability that exceeds the petaflops mark, and thus outperforms state-of-the-art supercomputers by several orders of magnitude in terms of energy efficiency and volume. Accordingly, building cognitive computing systems that reproduce the functionality of the human brain may yield computing systems of comparable power and energy efficiency. However, current hardware implementations of deep neural networks still cannot compete with the efficiency of biological neural systems because they are based on conventional von Neumann architecture, which cannot replicate the area efficiency, in situ learning, and non-volatile synaptic behavior of biological neural systems. Phase-change memory is a promising hardware alternative to traditional von Neumann architecture in mimicking biological neural systems in that it is compact, power-efficient, and is capable of storing information in its resistance/conductance states. However, the central idea in building cognitive hardware based on devices such as PCM is to store the synaptic weights as their conductance states and to perform the associated computational tasks in place; however, conventional PCM cannot currently store more than two possible synaptic weights. PCM implementations are currently able to store information in a crystalline and amorphous state, but are not able to reliably store information in intermediate states because conductance evolution from the crystalline to the amorphous state and vice versa is currently very imprecise; each pulse applied to the PCM cell changes the resistance by an inconsistent and unpredictable amount, so intermediate states cannot be reliably achieved. As such, the field of PCM requires a more precise method of updating the conductance of a PCM cell before PCM will be able to realize the functionality and the advantages of biological synapses.

PCM also has the potential to serve as a variable resistor in a cross-point array architecture. Cross-point arrays are memory architectures where nonvolatile resistance memory elements are placed at the cross-point of word-lines and bit-lines; such arrays have the potential for achieving a fast, random access, nonvolatile memory with stable high-speed operation, high density and small cell size. The use of PCM in the multi-level cell (MLC) nonvolatile resistance memory elements in a cross-point array has the potential to further lend the PCM's inherent advantages of low power consumption and small size, among others, to further improve the cross-point array. However, PCM is not suitable for use as MLC in cross-point arrays without significant improvements to the breadth and granularity of the resistance states that the PCM can be set to, which requires a more precise method of updating the conductance of the PCM cell to enable the PCM cell to reliably achieve intermediate resistance states.

Under the conventional approaches, precise control of conductance evolution in PCM is extremely difficult to obtain, preventing PCM from reliably achieving more than two states, and holding back its application in neurological computing devices and in cross-point arrays. As such, it may be advantageous to, among other things, implement a system that enables precise control over conductance evolution, thereby allowing PCM cells to achieve a number of intermediate phase states that may be as granular as the quantity of pulses used to transition the PCM cell from one state to the other. by preparing the PCM cell and applying specially calibrated pulses to ensure that each pulse produces a uniform change in the resistance of the PCM cell.

According to one embodiment, the invention is a method of increasing the linearity and number of steps for updating the weight of a phase-change memory (PCM) cell by modifying RESET voltage, applying a post-RESET forming annealing pulse, modifying weight update pulse width and amplitude, and/or applying a pre-annealing pulse. There are no universal optimal pulsing conditions; the weight update behavior of any given PCM cell is determined by a number of factors, including the design of the PCM cell and the phase-change materials used. As such, the linearity of the weight update behavior may only be improved by modifying the individual widths and amplitudes of each of the RESET voltage, the post-RESET forming annealing pulse, the weight update pulse, and/or the pre-annealing component of the weight update pulse on a per-PCM-cell basis in response to weight update behavior revealed through modeling or experimental results in order to tune the weight update behavior to produce improved linearity.

According to at least one embodiment, the invention is a method of modifying the RESET pulse applied to a PCM cell to increase the linearity of the weight update. The RESET pulse may be the electrical pulse applied to the PCM cell to melt and quench the programming region of the PCM cell and thereby return it to its RESET level; the RESET level may be the resistance of the PCM cell in its amorphous phase. The RESET pulse of the PCM cell may be modified by changing its width or amplitude. The width of a pulse is the amount of time between the leading and trailing edges of the pulse, while the amplitude is the maximum amount of the current or voltage of the pulse. Increasing the amplitude of the RESET pulse results in more amorphized material, and increases the threshold voltage required for switching, which is the voltage required to induce a programming current which increases dramatically during the programming of the PCM cell. Conversely, decreasing the amplitude of the RESET pulse results in less amorphized material, and decreases the threshold voltage required for switching. Increasing the width of the RESET pulse results in more amorphized material, and more time for heat conduction, and conversely decreasing the width of the RESET pulse results in less amorphized material, and less time for heat conduction. Generally, a smaller dome of crystallized material may be desirable in increasing linearity, but if the RESET pulse amplitude becomes too small, melting will not occur; as such, the RESET pulse amplitude must be a value that is as small as possible while still inducing melting.

The purpose of modifying the RESET pulse is to place the PCM cell into a state where subsequent weight update pulses will produce a more consistent and uniform change in the resistance of the cell. As an example, decreasing the amplitude of the RESET pulse may create a smaller dome of amorphized material, such that the path of crystallized material created by the weight update pulses are of equivalent size, allowing the dome to be crystallized integrally and improving the uniformity of the changes.

The system may modify the RESET pulse through an iterative process of adjusting the width and amplitude of the RESET pulse, applying the RESET pulse to the PCM cell, measuring the resistance of the PCM cell after a number of weight update pulses have been applied, and applying further modifications to the RESET pulse in response to the measured resistance after the number of pulses until the resistance change per weight update pulse falls below a threshold level of variance. The variance may be a value representing the uniformity of resistance changes in the PCM cell after each weight update pulse, averaged over all previously applied weight update pulses since the last RESET pulse, and the threshold level of variance may be a maximum level of variance between resistance changes considered tolerable for the purposes of creating intermediate states. Once the system has created a RESET pulse that results in a level of variance falling below the threshold level of variance, the system may store the parameters of that RESET pulse to apply to future RESET pulses.

According to at least one embodiment, the invention is a method of applying an incubation pulse after a RESET pulse to increase the linearity of the weight update. The phase change material used in PCM, which is the material that changes phase in response to electrical pulses, has an incubation time which represents the amount of energy that must be introduced to the phase change material before crystal growth can occur. The incubation time correlates with a number of weight update pulses that must be applied to the phase change material after RESET before the energy barrier to crystal growth is overcome, and an increase in conductance can be detected. In other words, the longer the incubation time, the more weight update pulses that must be applied to the PCM cell before there is any measurable change in conductance or resistance. The incubation time accordingly reduces the uniformity with which weight update pulses change the resistance/conductivity of the PCM cell by introducing a period where weight update pulses have no measurable effect on resistance/conductivity and increases the total number of pulses required to reach a given conductance/resistance. The incubation time can be reduced, and the number of weight update pulses needed before the resistance/conductivity is measurably changed decreased, by applying an incubation pulse after the RESET pulse has been applied. The incubation pulse may be a high duration low power pulse that anneals the PCM cell, causes the formation of a large amount of nuclei and overcomes the energy barrier for crystal growth, allowing subsequent weight update pulses to immediately produce measurable changes in the conductance/resistance of the PCM.

According to at least one embodiment, the invention is a method of modifying the width and amplitude of a weight update pulse to increase the linearity of the weight update. The weight update pulse may also be referred to as a partial SET pulse; the SET pulse is a high-duration low-power electronic pulse which changes the PCM from its amorphous state to its crystalline state by crystallizing the phase change material. However, the SET pulse can be divided into a series of smaller pulses, referred to as partial SET pulses or weight update pulses, which increment the conductance of the PCM, and its progress towards a crystalline state, in small amounts rather than completing the transition in one pulse. These weight update pulses can be modified by changing the pulses' width or amplitude. Increasing the amplitude may increase the slope of the resistance/conductivity changes and may decrease the incubation time. However, if the amplitude is too high, the linearity decreases. If the current is too high, melting followed by quenching will occur, decreasing the conductivity. If the current is too low, there will be no crystallization, and the resistance/conductivity will remain the same. As such, the amplitude must fall into a middle ground to produce maximum linearity. Likewise if the width is too small, there will not be enough time for crystallization to occur, resulting in no change to the resistance/conductivity, and if the width is too large, too much material crystallizes, resulting in a large jump in resistance/conductivity and reducing the number of weight update pulses before the crystalline phase is reached, which reduces the number of possible intermediate states. As such, the width must fall into a middle ground that is just large enough to induce crystallization without being so large as to allow fewer intermediate states than desired.

The system may modify the weight update pulse through an iterative process of adjusting the width and amplitude of the weight update pulse, applying the adjusted weight update pulse to the PCM cell, and measuring the conductance/resistance of the PCM cell after a number of weight update pulses have been applied, and applying further modifications to the weight update pulse in response to the measured resistance after the number of pulses until the resistance change per weight update pulse exceeds a threshold level of uniformity or linearity. Uniformity may be a measure of the variance of resistance changes in the PCM cell after each weight update pulse, and the threshold level of uniformity may be a maximum level of variance between conductance/resistance changes considered sufficient for the purposes of creating intermediate states. Once the system has created a weight update pulse that results in a level of variance falling below the threshold level of variance, the system may store the parameters of that weight update pulse to apply to future weight update pulses.

According to at least one embodiment, the invention is a method of applying a pre-annealing component to the weight update pulse to increase the linearity of the weight update. Due to the smaller, more incremental nature of weight update pulses compared to the SET pulse, weight update pulses may occasionally fail to initiate threshold switching of the material, and pathways of current may be formed and not grown, with the result that some weight update pulses may fail to produce a measurable effect on the resistance/conductivity of the PCM cell. This reduces the uniformity/linearity of the conductivity changes. By adding an annealing component to each weight update pulse, the first path to be created will be grown, reducing the likelihood that a weight update pulse will fail to produce a measurable effect on the resistance/conductivity of the PCM cell. The annealing component may be a high duration low power pulse that immediately precedes the short duration higher power weight update pulse, the width and amplitude of which are chosen carefully to increase the linearity of the weight update based, for example, on experimental results.

One skilled in the art may understand that embodiments of the invention may comprise any combination of a modified RESET pulse, a post-RESET incubation pulse, and/or a pre-annealing component added to the weight update pulse applied to the general process of changing the phase of PCM cells to improve the linearity of the weight update.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method, and program product to increase the linearity and uniformity of weight updates by modifying RESET voltage, applying a post-RESET annealing pulse, modifying weight update pulse width and amplitude, and/or applying a pre-annealing pulse to the weight update pulse.

Referring now to FIG. 1, a phase-change cycle 100 of phase change material 102 used in phase change memory (PCM) is depicted according to at least one embodiment of the present invention. Here, the phase change material 102 may be any material, such as chalcogenide glass, that is capable of existing in at least two phase states possessing differing electrical resistivity values and is capable of quickly and repeatedly transitioning between those states. The states may include a crystalline state 104, and an amorphous state 106. The crystalline state 104 is a state where the microscopic arrangement of the constituent atoms of the phase change material comprises symmetric patterns, such as lattices, that repeat along the principal directions of three-dimensional space. The crystalline state 104 may be referred to as the SET state and may represent a binary 1. The crystalline state 104 possesses low resistivity and high conductance relative to the amorphous state 106; the resistivity value of the phase change material 102 in its crystalline state 104 may be referred to as the PCM's SET level or resistivity. The amorphous state 106 is a state where the constituent atoms of the phase change material are disordered, lacking the long-range repeating patterns of atoms in a crystalline state 106. The amorphous state 106 may be referred to as the RESET state and may represent a binary 0. The phase change material 102 in its amorphous state possesses a high resistivity value relative to the crystalline state 106; this resistivity value may be referred to as the PCM's RESET level or resistivity.

The phase change material 102 may transition between phases using joule heating, whereby a current is passed through the phase change material 102 by electrodes in order to heat the phase change material. The phase change material 102 may transition from the crystalline state 104 to amorphous state 106 through a process called melt-quenching 108. Melt quenching 108 may entail applying a low-duration high-power pulse, called the melting pulse or the RESET pulse, to melt the phase change material 102 and reduce the order of its constituent atoms. The phase change material 102 may transition from the amorphous state 106 to crystalline state 104 through a process called annealing 110. Annealing 110 may entail applying a high-duration, low-power pulse, called the annealing pulse or SET pulse, to gradually heat and crystallize the phase change material 102.

The annealing process 110, unlike the melt-quenching process 108, can be achieved by a series of small annealing pulses, called partial SET pulses or weight update pulses, which may be smaller SET pulses that reduce the energy barrier of the phase change material 102 or cause some amount of crystal growth resulting in a measurable change to the resistance and conductivity of the phase change material 102. The process of applying a partial SET pulse to the phase change material 102 is referred to herein as a weight update. Each incremental increase in crystal growth between the amorphous state 106 and crystalline state 104 of the phase-change material 102 following a partial SET pulse may represent a distinct intermediate phase state of the phase change material 102, with a unique resistivity or conductivity value.

Figure 2:
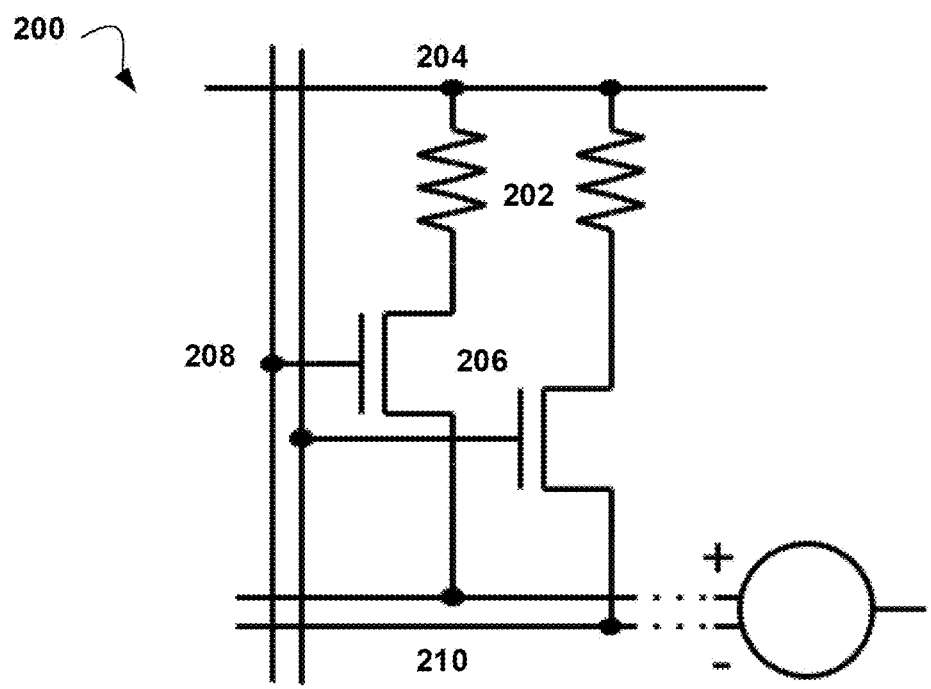
FIG. 2 is an electrical diagram illustrating a PCM synaptic device according to at least one embodiment of the present invention.

Referring now to FIG. 2, an electrical diagram illustrating a PCM synaptic device 200 is depicted according to at least one embodiment of the present invention. Here, phase change memory (PCM) cells 202 are depicted integrated into a memory array functioning, for example, as an array of synapses within a neural network. The PCM cells 202 are connected at one end to a bitline 204 and are connected at the other end to a pair of access transistors, which in turn are connected to word lines 208 and output lines 210. The PCM cells 202 may be further illustrated below with respect to FIG. 6A.

Figure 3:
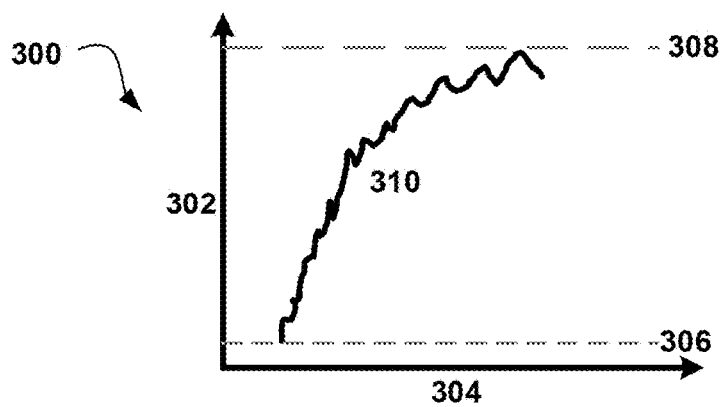
FIG. 3 is a graph illustrating a real weight update behavior of a PCM cell according to current methods.

Referring now to FIG. 3, a graph 300 illustrating a real weight update behavior of a PCM cell 202 is depicted. Here, the Y-axis 302 represents the conductivity of the phase change material 102 while the X-axis 304 represents a number of partial SET pulses applied to the phase change material 102. The line 310 represents the relationship between the conductivity of the phase change material 102 between the RESET level 306 and a SET level 308, and the number of partial SET pulses applied to the phase change material 102. Line 310 represents weight update behavior under current weight update methods; it is irregular and non-linear, producing non-uniform changes in the conductivity of the PCM cell 202 after each pulse.

Figure 4:
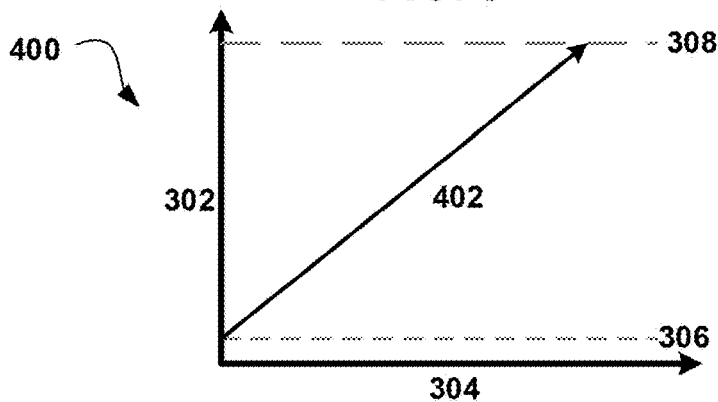
FIG. 4 is a graph illustrating a target weight update behavior of a PCM cell according to at least one embodiment of the present invention.

Referring now to FIG. 4, a graph illustrating an ideal weight update behavior 400 of a PCM cell 202 is depicted according to at least one embodiment of the present invention. Here, the Y-axis 302 represents the conductivity of the phase change material 102 while the X-axis 304 represents a number of partial SET pulses applied to the phase change material 102. The line 402 represents the relationship between the conductivity of the phase change material 102 between the RESET level 306 and a SET level 308, and the number of partial SET pulses applied to the phase change material 102. Line 402 represents the ideal weight update behavior which embodiments of the current invention may achieve or approach, where the conductance of the phase change material 102 changes uniformly with each partial SET pulse, resulting in a smooth and linear weight update that supports intermediate phase states and, by extension, intermediate memory states.

Figure 5:
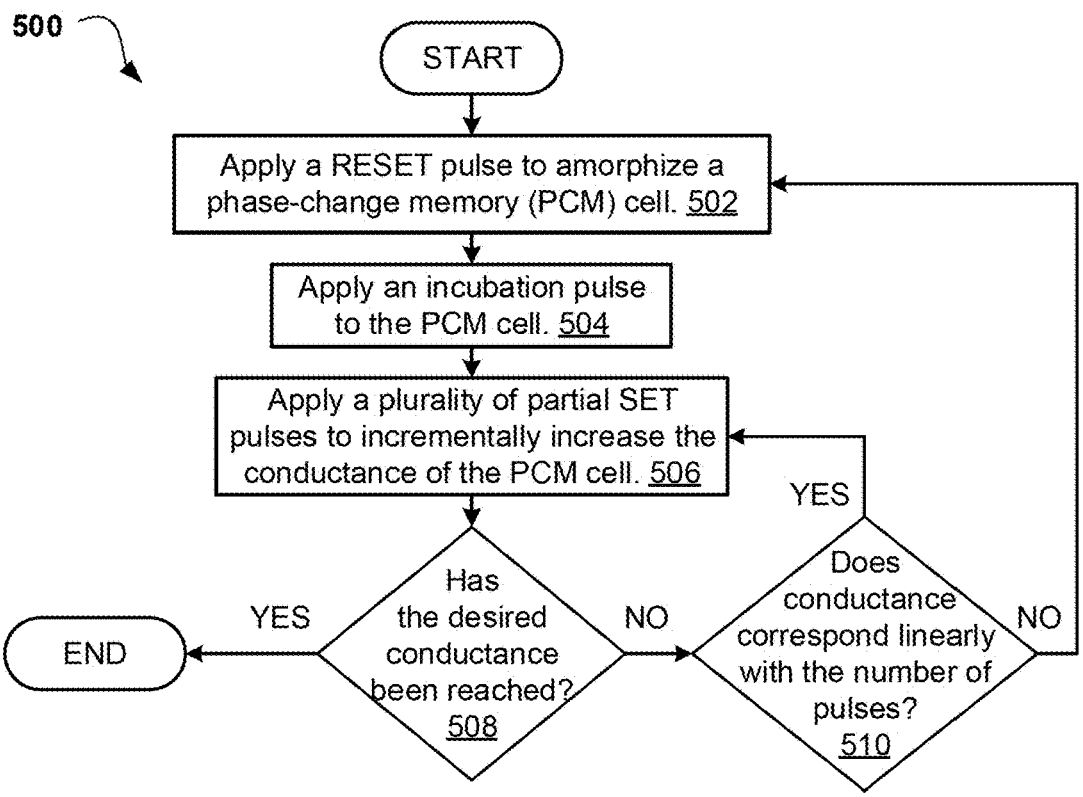
FIG. 5 is an operational flowchart illustrating a phase-change update process according to at least one embodiment of the present invention.

Referring now to FIG. 5, an operational flowchart illustrating a phase-change update process 500 is depicted according to at least one embodiment. At 502, the system applies a RESET pulse to amorphized a phase change memory (PCM) cell 202. Here, the width and amplitude of the RESET pulse may be specially formulated to prepare the PCM cell 202 such that future partial SET pulses produce a more consistent effect on the conductivity/resistance of the PCM cell 202. The width and amplitude of the RESET pulse may be tuned to produce within the PCM cell 202 a volume of amorphized material, a threshold voltage required for switching, and a heat conduction time that facilitate uniform and consistent crystal growth. The amplitude of the RESET pulse may also be tuned to reduce the incubation time of the PCM cell 202, reducing the number of partial SET pulses necessary to overcome the energy barrier to crystal growth and produce measurable changes in the conductance/resistivity of the phase change material 102.

At 504, the system applies a low-power, high-duration annealing pulse to the PCM cell. Here, the post-RESET annealing pulse, or incubation pulse, may be a high-duration low-power pulse applied after a RESET pulse with a width and amplitude specially calibrated based on the incubation time of the phase change material, such that the incubation pulse introduces just enough energy to the phase-change material to overcome the energy barrier for crystal growth. By overcoming the energy barrier and causing the formation of a large amount of nuclei, the incubation pulse allows all energy introduced by future partial SET pulses to contribute to crystal growth rather than to overcoming the energy barrier, resulting in immediate and measurable changes in the conductance/resistance of the PCM cell 202. The incubation pulse may be illustrated further below with respect to FIGS. 7 and 8.

At 506, the system applies number of partial SET pulses to gradually increase the conductance of the PCM cell. The partial SET pulses may be pulses of low duration and of a power lower than the power of the SET pulse. Here, the width and amplitude of the partial SET pulses may be specially formulated to produce a consistent effect on the conductivity/resistance of the PCM cell 202. The amplitude of the partial SET pulse may be tuned such that the current is neither so high as to induce melt-quenching, nor too low to induce crystallization, and such that the pulses maintain a ratio of change in conductivity to number of pulses sufficient to produce a linear weight update as illustrated in FIG. 4. The width of the partial SET pulse may be tuned such that the duration is neither too short to induce crystallization, nor so long that too much material is crystallized, and saturation is reached too quickly. The partial SET pulse may be illustrated further below with respect to FIGS. 6B and 9A.

At 508, the system may determine whether the desired conductance has been reached. The desired conductance may be the conductance that is associated with a particular state of the PCM cell, corresponding for example with the crystalline state or with a desired intermediate state. In some embodiments of the invention, the system may rather determine whether a desired number of pulses has been reached, wherein the desired number of pulses may be a number of pulses associated with a particular state of the PCM cell. The system may determine the conductance by applying a read pulse to the PCM cell after each pulse is applied. According to one implementation, if the system determines that the desired conductance has not been reached (step 508, "NO" branch), the system may continue to step 510 to determine whether the conductance corresponds linearly with the number of pulses. If the system determines that the desired conductance has been reached (step 508, "YES" branch), then the PCM cell has been set to the desired conductance and the system may conclude the process.

At 510, the system may determine whether the conductance corresponds linearly with the number of pulses. The system may compare the conductance measured in step 508 against the number of steps to determine a level of variance between resistance changes. The variance may be the variance averaged over all applied pulses since the last RESET pulse. The variation may then be compared against the threshold level of variance, which may be a maximum level of variance between resistance changes considered sufficiently uniform to allow for creating intermediate states. If the variation exceeds the threshold value of variance (step 510, "NO" branch), the system may proceed to step 502 to apply a RESET pulse to amorphize the phase-change memory (PCM) cell, essentially resetting the PCM cell and starting the process anew. In some embodiments of the invention, the system may modify the width and/or amplitudes of the RESET pulse, incubation pulse, and/or the partial SET pulses to improve uniformity of the weight update on the next pass. If the system determines that the variation falls below the threshold value of variance (step 508, "YES" branch), then the system may move to step 506 to apply a plurality of partial SET pulses to the PCM to continue incrementally increasing the conductance of the PCM cell.

In some embodiments of the invention, a pre-annealing component may be applied to the partial SET pulses. The pre-annealing component may be a high duration low power pulse that immediately precedes the short duration relatively higher power pulse of the ordinary partial SET pulse. The annealing component may be tuned in width and amplitude to improve the chances that the partial SET pulse induces threshold switching and crystal growth sufficient to cause measurable change in resistance/conductivity of the PCM cell 202. Threshold switching may refer to a phenomenon where, when a voltage above a particular threshold voltage is applied to a phase change material in the amorphous phase, the resulting large electrical fields greatly increase the electrical conductivity. Because of this conductivity increase, a larger current may be applied to the phase change material, resulting in increased temperature in the phase change material which in turn may lead either to crystallization or melting. The partial SET pulse with annealing component may be illustrated further below with respect to FIGS. 6C and 9B.

Figure 6A:
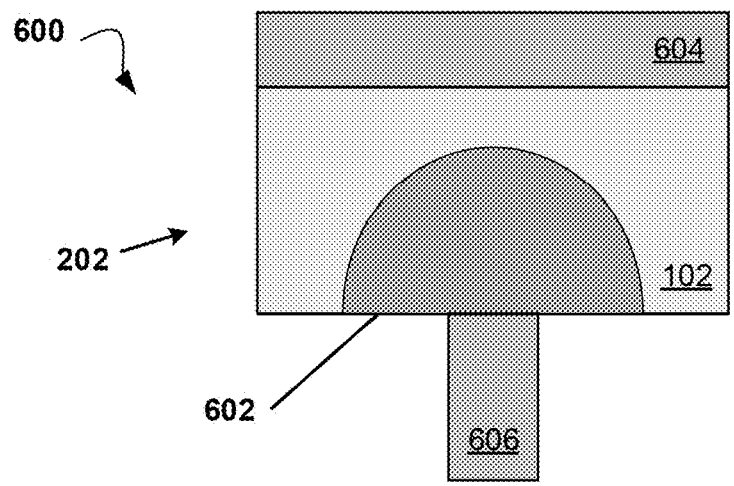
FIG. 6A is a diagram depicting a PCM "mushroom" cell after RESET pulse according to at least one embodiment of the present invention.

Referring now to FIG. 6A, a diagram 600 depicting a PCM "mushroom" cell 202 after a RESET pulse is depicted according to at least one embodiment of the present invention. Here, the PCM cell 202 comprises a layer of phase change material 102, which in turn comprises a programming region 602 which may be a region of the phase change material 102 that changes phase in response to programming pulses applied by the top electrode 604 and the bottom electrode 606. Programming pulses may be any pulses applied to the phase change material 102 as part of the process of changing its phase, including but not limited to SET pulses, partial SET pulses, RESET pulses, and incubation pulses. The size of the programming region 602, and the volume of phase-change material 102 whose phase state is modified by the programming pulse, may increase or decrease based on the amplitude of the programming pulse.

Figure 6B:
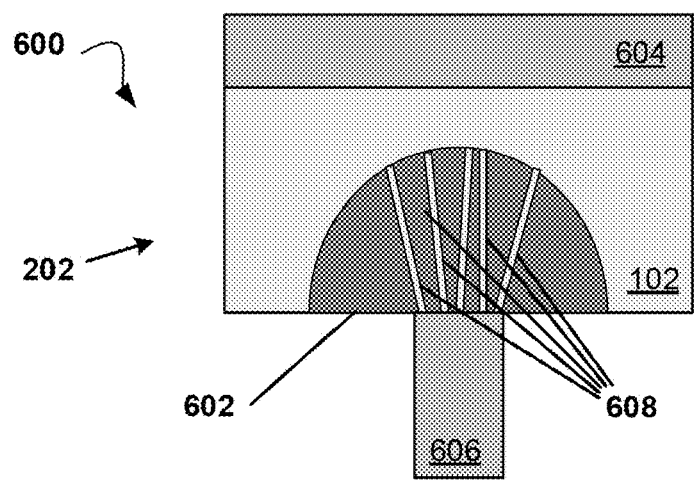
FIG. 6B is a diagram depicting a PCM "mushroom" cell after partial SET pulse without pre-annealing according to at least one embodiment of the present invention.

Referring now to FIG. 6B, a diagram 600 depicting a PCM "mushroom" cell 202 without pre-annealing is depicted according to at least one embodiment of the present invention. Here, the system is applying partial SET pulses to the PCM cell 202 to induce gradual crystallization, resulting in the formation of various thin crystallized current paths 608 through the programming region 602. The partial SET pulses, absent a pre-annealing component, have a chance to form new pathways of current through the programming region 602 rather than growing the existing current pathways 608; forming new current pathways and growing existing current pathways 608 cause different amounts of change in the resistance/conductivity of the PCM cell 202, resulting in inconsistent weight update behavior.

Figure 6C:
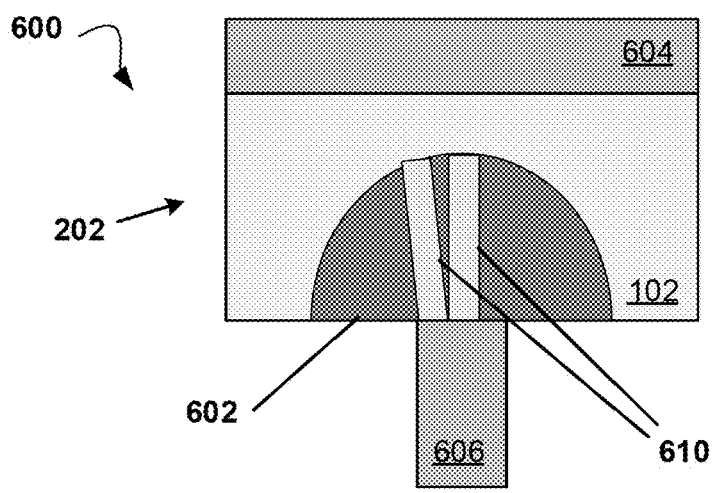
FIG. 6C is a diagram depicting a PCM "mushroom" cell after partial SET pulse with pre-annealing according to at least one embodiment of the present invention.

Referring now to FIG. 6C, a diagram 600 depicting a PCM "mushroom" cell 202 with pre-annealing is depicted according to at least one embodiment of the present invention. Here, the system is applying partial SET pulses with a pre-annealing component to the PCM cell 202, resulting in the pulses creating crystalline paths 610 through the programming region 602 which is then expanded by subsequent pulses; energy is therefore not wasted forming new paths and is applied mostly to growing the crystalline structure, resulting in more consistent weight update behavior.

Figure 7:
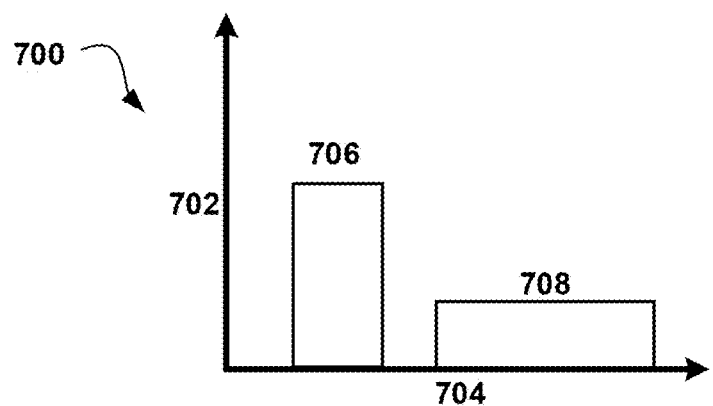
FIG. 7 is a graph illustrating a RESET and incubation pulse, respectively, according to at least one embodiment of the present invention.

Referring now to FIG. 7, a graph 700 illustrating a RESET pulse and incubation pulse, respectively, is depicted according to at least one embodiment of the present invention. Here, the Y-axis 702 represents the programming current of the PCM cell 202 while the X-axis 704 represents time. The bar 706 represents the current of the PCM cell 202 during a RESET pulse, while the bar 708 represents the current of the PCM cell 202 during the incubation pulse. The RESET pulse causes a higher current relative to the incubation pulse, but the incubation pulse is much longer than the RESET pulse. The incubation pulse may be based on the energy barriers for crystal growth; different phase change materials have different energy barriers for crystal growth, so the amplitude of the incubation pulse must be tuned to match the energy barrier of the phase change material.

Figure 8:
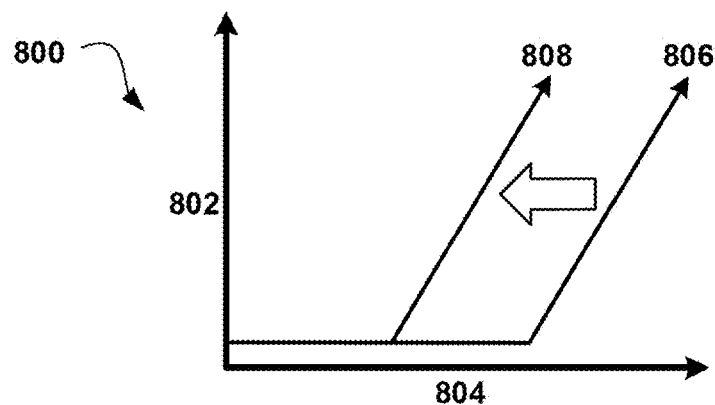
FIG. 8 is a graph indicating the change in conductance of a PCM cell during a weight update with and without an annealing step, according to at least one embodiment of the present invention.

Referring now to FIG. 8, a graph 800 indicating the change in conductance of a PCM cell 202 during a weight update with and without an annealing step is depicted according to at least one embodiment of the present invention. Here, the Y-axis 802 represents the conductance of the PCM cell 202 while the X-axis 804 represents the number of partial SET pulses applied to PCM cell 202. The line 806 represents the relationship of the conductance of PCM cell 202 to the number of pulses applied to PCM cell 202 without a previously applied incubation pulse. The line 808 represents the relationship of the conductance of PCM cell 202 to the number of pulses applied to PCM cell 202 with a previously applied incubation pulse; one can observe from both line 806 and line 808 that a number of pulses must be applied to PCM cell 202 before there is a measurable change in conductivity of the PCM cell 202, but in the case where an incubation pulse has been applied, fewer number of pulses are necessary to create a measurable change in conductivity of the PCM cell 202, as the incubation pulse eliminates some number of pulses that fail to cause a measurable change in conductivity.

Figure 9A:
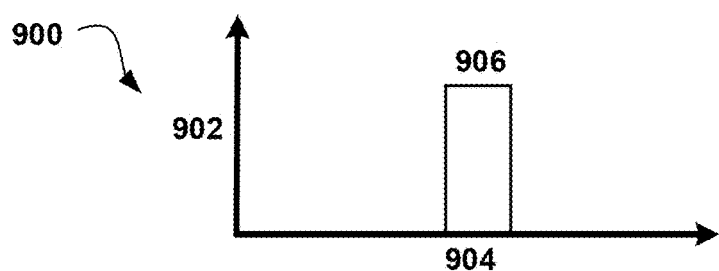
FIG. 9A is a graph illustrating a partial SET pulse according to at least one embodiment of the present invention.

Referring now to FIG. 9A, a graph 900 illustrating a partial SET pulse is depicted according to at least one embodiment of the present invention. Here, the Y-axis 902 represents the current of the PCM cell 202 while the X-axis 904 represents time. The bar 906 represents the current of the PCM cell 202 during a partial SET pulse. All pulses applied to the PCM cell 202 during the weight update process may be partial SET pulses, and the partial SET pulses may be of uniform width and amplitude and/or applied at uniform time intervals.

Figure 9B:
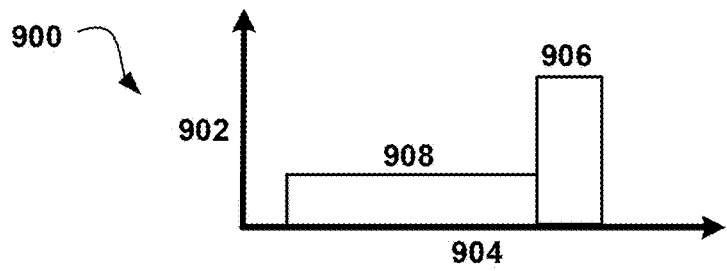
FIG. 9B is a graph illustrating a partial SET pulse with a pre-annealing component according to at least one embodiment of the present invention.

Referring now to FIG. 9B, a graph 900 illustrating a partial SET pulse with a pre-annealing component is depicted according to at least one embodiment of the present invention. Here, the Y-axis 902 represents the current of the PCM cell 202 while the X-axis 904 represents time. The bar 908 represents the current of the PCM cell 202 during the pre-annealing component of a partial SET pulse, while the bar 906 represents the current of the component corresponding with the original partial SET pulse, where the component corresponding with the original partial SET pulse may be a pulse comprising the same width and amplitude of a partial SET pulse otherwise applied during the weight update process. The pre-annealing component and the component corresponding with the original partial SET pulse may be combined into a single composite partial SET pulse. All pulses applied to the PCM cell 202 during the weight update process may be composite partial SET pulses, and the composite partial SET pulses may be applied at uniform time intervals and/or have pre-annealing components and original partial SET pulse components of uniform width and amplitude.

It may be appreciated that FIGS. 1-9 provide only illustrations of one implementation and do not imply any limitations with regard to how different embodiments may be implemented. Many modifications to the depicted environments may be made based on design and implementation requirements.

The descriptions of the various embodiments of the present invention have been presented for purposes of illustration but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method for increasing linearity of a weight update of a phase change memory (PCM) cell, the method comprising:
responsive to applying a RESET pulse to amorphize the PCM cell, applying an incubation pulse to the PCM cell; and
applying a plurality of partial SET pulses to incrementally increase the conductance of the PCM cell.

2. The method of claim 1, further comprising:
responsive to a variance of the weight update meeting or exceeding a threshold value, modifying an amplitude and/or width of the RESET pulse, the incubation pulse, and/or the partial SET pulse.

3. The method of claim 1, wherein an amplitude and width of the incubation pulse are based on an incubation time of a phase change material comprising the PCM cell.

4. The method of claim 1, wherein an amplitude and/or width of the partial SET pulses are pre-determined to produce a weight update behavior that falls below a threshold level of variance.

5. The method of claim 1, wherein the plurality of partial SET pulses further comprise a pre-annealing component.

6. The method of claim 5, wherein an amplitude and width of the pre-annealing component are formulated to improve a crystal growth rate.

7. The method of claim 1, further comprising:
responsive to a variance of the weight update meeting or exceeding a threshold value, applying a RESET pulse to amorphize the PCM cell.

8. A computer system for increasing linearity of a weight update of a phase change memory (PCM) cell, the computer system comprising:
one or more PCM cells, one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
responsive to applying a RESET pulse to amorphize the PCM cell, applying an incubation pulse to the PCM cell; and
applying a plurality of partial SET pulses to incrementally increase the conductance of the PCM cell.

9. The computer system of claim 8, further comprising:
responsive to a variance of the weight update meeting or exceeding a threshold value, modifying an amplitude and/or width of the RESET pulse, the incubation pulse, and/or the partial SET pulse.

10. The computer system of claim 8, wherein an amplitude and width of the incubation pulse are based on an incubation time of a phase change material comprising the PCM cell.

11. The computer system of claim 8, wherein an amplitude and/or width of the partial SET pulses are pre-determined to produce a weight update behavior that falls below a threshold level of variance.

12. The computer system of claim 8, wherein the plurality of partial SET pulses further comprise a pre-annealing component.

13. The computer system of claim 12, wherein an amplitude and width of the pre-annealing component are formulated to improve a crystal growth rate.

14. The computer system of claim 8, further comprising:
responsive to a variance of the weight update meeting or exceeding a threshold value, applying a RESET pulse to amorphize the PCM cell.

15. A computer program product for increasing linearity of a weight update of a phase change memory (PCM) cell, the computer program product comprising:
one or more computer-readable tangible storage medium and program instructions stored on at least one of the one or more tangible storage medium, the program instructions executable by a processor to cause the processor to perform a method comprising:
responsive to applying a RESET pulse to amorphize the PCM cell, applying an incubation pulse to the PCM cell; and
applying a plurality of partial SET pulses to incrementally increase the conductance of the PCM cell.

16. The computer program product of claim 15, further comprising:
responsive to a variance of the weight update meeting or exceeding a threshold value, modifying an amplitude and/or width of the RESET pulse, the incubation pulse, and/or the partial SET pulse.

17. The computer program product of claim 15, wherein an amplitude and width of the incubation pulse are based on an incubation time of a phase change material comprising the PCM cell.

18. The computer program product of claim 15, wherein an amplitude and/or width of the partial SET pulses are pre-determined to produce a weight update behavior that falls below a threshold level of variance.

19. The computer program product of claim 15, wherein the plurality of partial SET pulses further comprise a pre-annealing component.

20. The computer program product of claim 19, wherein an amplitude and width of the pre-annealing component are formulated to improve a crystal growth rate.

\* \* \* \* \*